United States Patent
Baril et al.

(10) Patent No.: US 10,468,540 B1
(45) Date of Patent: Nov. 5, 2019

(54) ALSB LATTICE MATCHED BARRIER INFRARED DETECTOR TO IMPROVE QUANTUM EFFICIENCY AND PROCESS YIELD

(71) Applicant: United States of America, as represented by the Secretary of the Army, Fort Belvoir, VA (US)

(72) Inventors: Neil F. Baril, Stafford, VA (US); Sumith V. Bandara, Fairfax Station, VA (US)

(73) Assignee: UNITED STATES OF AMERICA, AS REPRESENTED BY THE SECRETARY OF THE ARMY, Washington, DC (US)

( * ) Notice: Subject to any disclaimer, the term of this patent is extended or adjusted under 35 U.S.C. 154(b) by 1716 days.

(21) Appl. No.: 13/987,246

(22) Filed: Dec. 23, 2013

(51) Int. Cl.
*H01L 31/00* (2006.01)

(52) U.S. Cl.
CPC .................................. *H01L 31/00* (2013.01)

(58) Field of Classification Search
CPC ......... H01L 31/035236; H01L 31/0304; H01L 31/109
USPC .................................................. 257/E31.001
See application file for complete search history.

(56) References Cited

U.S. PATENT DOCUMENTS

| | | | |
|---|---|---|---|
| 7,687,871 B2 | 3/2010 | Maimon | |
| 7,737,411 B2 | 6/2010 | Gunapala et al. | |
| 8,368,051 B2* | 2/2013 | Ting | B82Y 20/00 257/21 |
| 8,928,036 B2* | 1/2015 | Ting | H01L 31/0304 257/184 |
| 2010/0072514 A1* | 3/2010 | Ting | H01L 31/0304 257/184 |

FOREIGN PATENT DOCUMENTS

WO    2010/036956 A1    4/2010

\* cited by examiner

*Primary Examiner* — Mark Hellner
(74) *Attorney, Agent, or Firm* — Richard J. Kim

(57) ABSTRACT

An AlSb lattice matched barrier infrared detector architecture with the AlSb binary barrier layer enables implementation of strain layer superlattice absorbers with higher absorption coefficients for improved quantum efficiency, presents a simplified structure for epitaxial growth, and enables the utilization of bulk $InAs_{0.815}Sb_{0.185}$ absorber material with a 5.0 µm cutoff for both single and dual color devices. Such an infrared detector is formed by growing the detector material; bottom contact, $1^{st}$ absorber layer, AlSb barrier, optional graded layer, $2^{nd}$ absorber layer, top contact, on top of an AlSb lattice matched buffer layer. Epitaxial growth on the AlSb lattice enables the deposition of unstrained bulk $InAs_{0.815}Sb_{0.185}$ with a 5.0 µm cutoff, as well as $InAs/InAs_{(x)}Sb_{(1-x)}$ superlattice absorbers with a continuously tunable cutoff from mid-wavelength to long-wavelength infrared.

17 Claims, 3 Drawing Sheets

ALSB LATTICE MATCHED BARRIER INFRARED DETECTOR TO IMPROVE QUANTUM EFFICIENCY AND PROCESS YIELD

GOVERNMENT INTEREST

The invention described herein may be manufactured, used, sold, imported, and/or licensed by or for the Government of the United States of America.

FIELD OF THE INVENTION

This invention relates in general to infrared detectors, and more particularly, to AlSb lattice matched barrier infrared detectors.

BACKGROUND OF THE INVENTION

The performance and cost of the pixilated detector arrays are limiting factors for infrared imaging systems. The resolution of an imaging system is governed by the collecting optics and the format of the array. The demand for higher definition images with the same or even wider view angles coupled with size constraints for the overall system limits advances primarily to the imaging array as there is little room for further improvements to the imaging optics. This means that smaller and smaller pixel sizes are required to attain the desires performance improvements. Smaller pixel sizes enable larger numbers of devices of the same size format to be produced on the same substrate thus potentially reducing costs, however the processing challenges associated with smaller pixel sizes dramatically reduce yield contributing to increased cost for the detector arrays. Barrier detectors offer the potential for higher process yields of larger format arrays with smaller pixel sizes that would reduce costs and increase the resolution of infrared imaging systems.

The currently employed strategy for MWIR and LWIR superlattice growth involves epitaxial growth of designed superlattice structures on GaSb substrates with a lattice constant of 6.09 angstroms. The choice of GaSb is due to the commercial availability of GaSb substrates. The only other commercially available substrate near this lattice constant is InAs at 6.05 angstroms. The most common superlattice grown for MWIR and LWIR applications is comprised of InAs and GaSb layers with InSb interfaces to match the lattice constant of the superlattice to the GaSb substrate. However, short minority carrier lifetimes in GaSb containing materials is proving to be a formidable challenge to overcome. More recent studies have incorporated "Ga-free" superlattice absorbers comprised of InAs and $InAs_{(x)}Sb_{(1-x)}$ superlattice layers due to the ability to grow higher quality material with much longer lifetimes. The Ga-free superlattice has the added advantage of being simpler to grow than the Ga containing material. This is due to the reduced number of shutter actions required per superlattice period as a result of removing an element from the recipe, Ga.

Recent results for Ga-free nBn devices grown on GaSb have shown very promising performance in mid-wavelength devices, but low quantum efficiency in long-wavelength devices. Analysis of device data suggests the QE of the long-wavelength nBn devices is being limited by low hole mobility. The ability to grow material with a slightly larger lattice constant would enable the period thickness of the $InAs/InAs_{(x)}Sb_{(1-x)}$ superlattice to be reduced, and increase the absorption coefficient. With this approach a thinner layer of the absorber would be required for operation resulting in shorter diffusion lengths for charge collection thus minimizing the impact of the low carrier mobility.

FIG. 1 shows an exemplary band edge alignment plotted verses lattice constant of relevant III-V semiconductors. Specifically, the vertical dashed lines indicate the currently used GaSb lattice constant and to the right the proposed AlSb lattice constant. It is important to note that the valence band for the Al bearing material increases to the right presenting a more ideal line up between the barrier layer and potential absorber layers. FIG. 1 displays the relative unstrained conduction and valence band energies for the III-V semiconductors commonly used in mid and long wavelength infrared detection. Any semiconductor device architecture that includes a heterojunction will also include band offsets in the conduction band, valence band, or both the conduction and valence bands. If not properly designed, these offsets can have a detrimental impact on device performance by introducing depletion regions and/or forming unwanted barriers to current flow.

FIG. 2 shows exemplary band diagrams demonstrating the importance of valence band lineup for the nBn structure. Part a) shows the flat band diagram for a device structure with a valence band offset (the valence band of the barrier layer is below the valence band of the absorber). Part b) shows this device at operating bias with a significant depletion region in the absorber associated with overcoming the band offset. Part c) shows the band lineup of a MWIR nBn device grown on the AlSb lattice. Note that there is not a valence band offset for this device.

With the nBn architecture a large offset in the conduction band is desired, but an offset in the valence band is detrimental to device performance. As an illustration FIG. 2 a) shows the flat band diagram for an nBn device with a very large valence band offset. In order to operate this device a large external bias will be necessary to overcome the barrier to holes formed in the valence band. FIG. 2 b) shows the band diagram of the same device with a sufficient external bias to overcome the barrier. This device will not only require a high bias to operate, but the g-r component of the dark current will be present at the operating bias due to the depletion region formed in the absorber, thus diminishing the advantage of the barrier architecture. FIG. 2 c) is an example of an ideal heterojunction where the valence band offset places the barrier layer valence band energy slightly above the valence band energy of the absorber layers. To obtain an $InAs/InAs_{(x)}Sb_{(1-x)}$ superlattice device with this lineup lattice matched to GaSb requires the use of a complex quaternary $Al_{(y)}Ga_{(1-y)}Sb_{(x)}As_{(1-x)}$ barrier with sufficient Ga content to raise the valence band energy level of the barrier above that of the absorber. If the device is lattice matched to AlSb, strain balanced $InAs/InAs_{(x)}Sb_{(1-x)}$ superlattice absorbers can be used in conjunction with AlSb binary barrier layer as displayed in FIG. 2c).

Substrates with a lattice constant matching AlSb are not commercially available. However, the use of metamorphic buffer layers affords the possibility to grow infrared detector materials with a wide variety of crystalline lattice constants on commercially available substrates. For III-V based semiconductors, these layers require the precise control of at minimum three constituent atoms, making reproducibility a concern. Any deviation from the designed lattice constant in the buffer layer will carry over into infrared device layers with the potential of diminishing performance. Matching the lattice to a pure binary semiconductor, such as AlSb, is advantageous in ensuring the target lattice constant is achieved. Furthermore shifting the lattice constant to match that of AlSb enables the application of a binary barrier layer, AlSb, opposed to ternary, $AlAs_{(x)}Sb_{(1-x)}$, and quaternary, $Al_{(y)}Ga_{(1-y)}Sb_{(x)}As_{(1-x)}$, barrier layers that are presently used in GaSb lattice matched nBn devices to avoid valence band offsets.

SUMMARY OF THE INVENTION

The AlSb lattice matched barrier infrared detector architecture with the AlSb binary barrier layer described in this invention enables the implementation of strain layer superlattice absorbers with higher absorption coefficients for improved quantum efficiency, presents a simplified structure for epitaxial growth, and enables the utilization of bulk $InAs_{0.815}Sb_{0.185}$ absorber material with a 5.0 µm cutoff for both single and dual color devices. The proposed infrared detector is formed by growing the detector material; bottom contact, 1$^{st}$ absorber layer, AlSb barrier, optional graded layer, 2$^{nd}$ absorber layer, top contact, on top of an AlSb lattice matched buffer layer. Epitaxial growth on the AlSb lattice enables the deposition of unstrained bulk $InAs_{0.815}Sb_{0.185}$ with a 5.0 µm cutoff, as well as $InAs/InAs_{(x)}Sb_{(1-x)}$ superlattice absorbers with a continuously tunable cutoff from mid-wavelength to long-wavelength infrared. One motivation for epitaxial growth on the larger lattice constant AlSb lattice, is the reduction of the superlattice period thickness to about half that of superlattice material matched to the standard GaSb lattice. A reduction in superlattice period thickness can be achieved by increasing the lattice constant to any value from that of GaSb to a constant near that of InSb, however targeting arbitrary lattice constants via epitaxial growth of metamorphic buffer layers is challenging and would lead to large run to run growth variations. Targeting a pure binary layer, AlSb, is much simpler and will enable greater run to run stability for material growth. Furthermore, the valence bands of both the $InAs_{0.815}Sb_{0.185}$ and the mid-wavelength $InAs/InAs_{(x)}Sb_{(1-x)}$ superlattice materials are slightly lower in energy than the binary AlSb barrier such that there is no offset blocking the minority charge carriers, while the conduction band of the AlSb is much higher forming a barrier to the majority charge carriers.

BRIEF DESCRIPTION OF THE DRAWINGS

Additional advantages and features will become apparent as the subject invention becomes better understood by reference to the following detailed description when considered in conjunction with the accompanying drawings wherein.

DETAILED DESCRIPTION

The invention described here as written is intended for a new class of detectors known as "nBn detectors" or "xBn detectors" or "barrier infrared photodetectors" discussed in several U.S patents/applications (U.S. Pat. No. 7,687,871 by Maimon et al., U.S. Pat. No. 7,737,411 by Gunapala et al., and (U) U.S. patent application Ser. No. 13/573,906 by Bandara et al.), hereinafter variously incorporated by reference as barrier infrared detectors.

A typical single color barrier infrared detector is comprised of a lightly or unintentionally doped semiconductor absorber layer and a large-bandgap lightly or unintentionally doped barrier layer sandwiched between two heavily doped contact layers. With a two color barrier infrared detector, absorber layers are in inserted on both sides of the wide-bandgap barrier layer. These layers are grown on semiconductor substrates from bottom to top, with the (bottom) contact, the absorber, the barrier and the (top) contact in consecutive order. The band offset between the absorber and the barrier layers is designed such that only the minority carriers are allowed to flow between contacts while the majority carriers are blocked by the barrier.

Strain layer superlattice based infrared detectors are almost exclusively grown on GaSb substrates, with the lattice constant of GaSb maintained throughout the structure. This includes barrier layer devices utilizing a superlattice absorber. The constraint of growing on a GaSb lattice limits the range of superlattice recipes, and requires a barrier layer that is comprised of at minimum 3 elemental components. These components are typically Al, Sb, and As. In many cases, Ga is also added to the barrier to adjust the valence band lineup between the barrier and absorber layers. Lattice matching the barrier infrared detector device to AlSb instead of GaSb will enable the use of bulk binary AlSb as the barrier material, expand the range of compatible superlattice recipes to include those with higher absorption coefficients, and enable the use of bulk MWIR absorber material.

The advantages of AlSb barrier layer include simplified composition for structure growth, higher valence band energy level than GaSb matched $AlAs_{(x)}Sb_{(1-x)}$ to avoid detrimental valence band offsets between the absorber and barrier layers, simplified chemistry for detector sidewall passivation, and is advantageous for chemical and electrical passivation of the detector pixel sidewalls. The superlattice recipes with a lattice constant matching AlSb have periods nearly half as thick, similar effective hole masses, and per-period absorption coefficients that are the same as or greater than those matched to GaSb. This equates to higher potential quantum efficiency, and reduces the necessary thickness of the absorber layers for a potential reduction in dark current.

Figure 1:
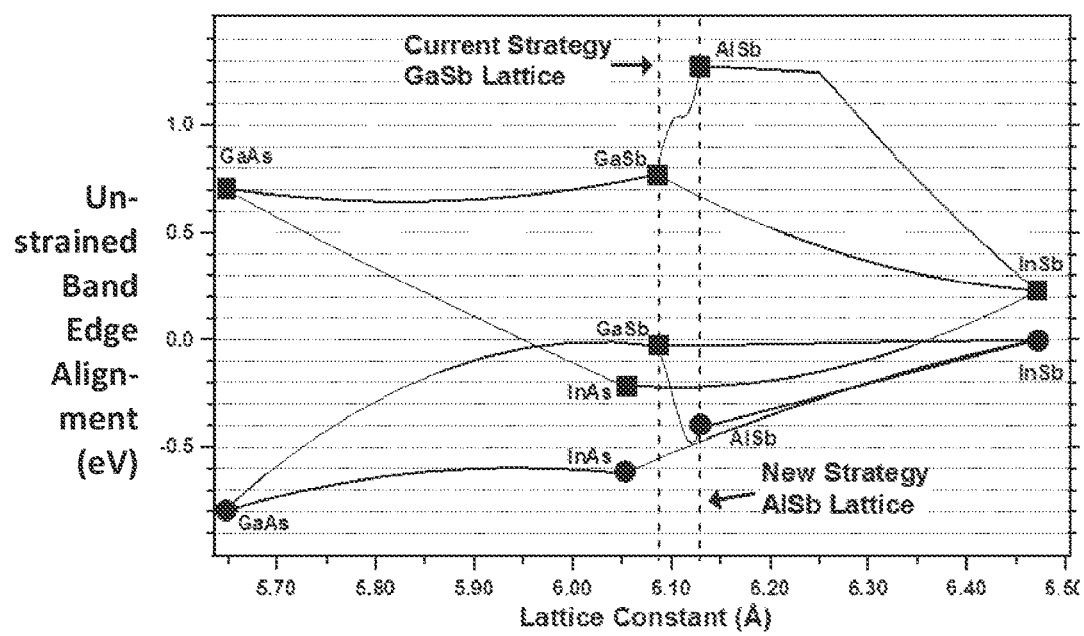
FIG. 1 shows an exemplary band edge alignment plotted verses lattice constant of relevant III-V semiconductors.
Figure 2:
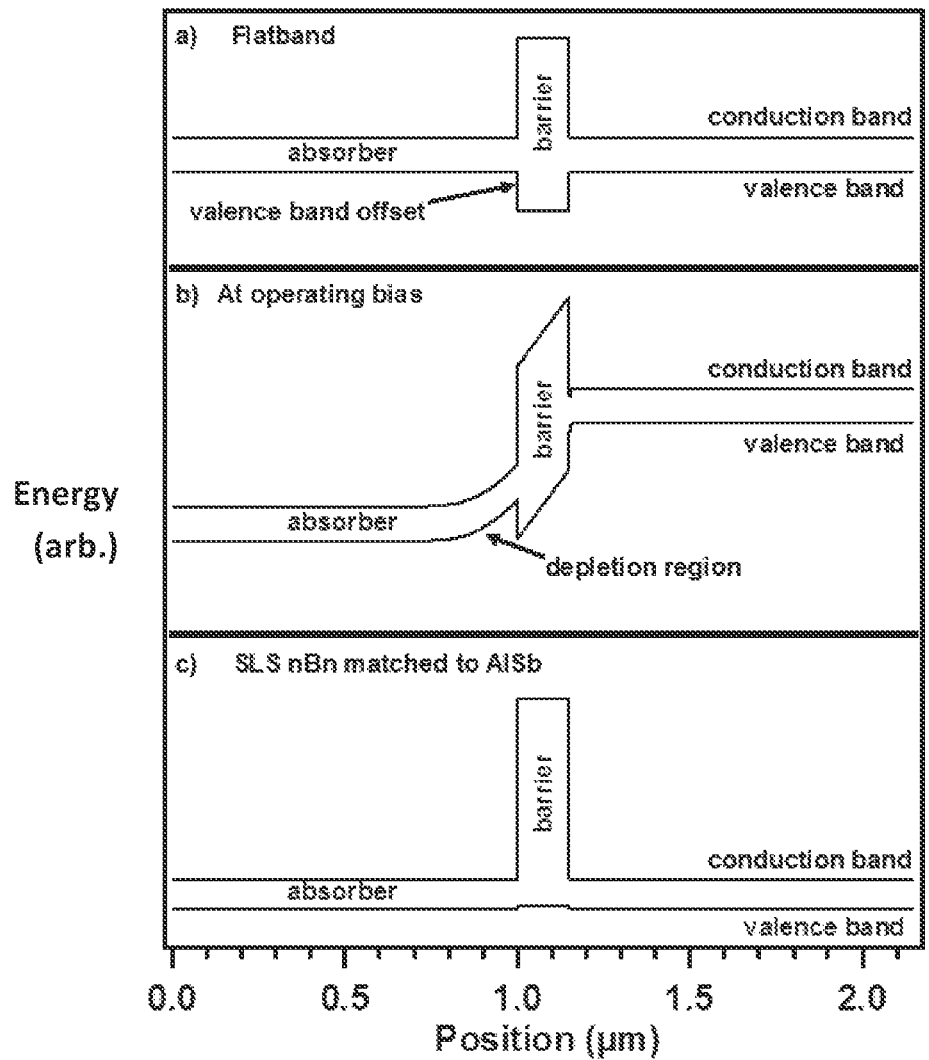
FIG. 2 shows exemplary band diagrams demonstrating the importance of valence band lineup for the nBn structure.
Figure 3:
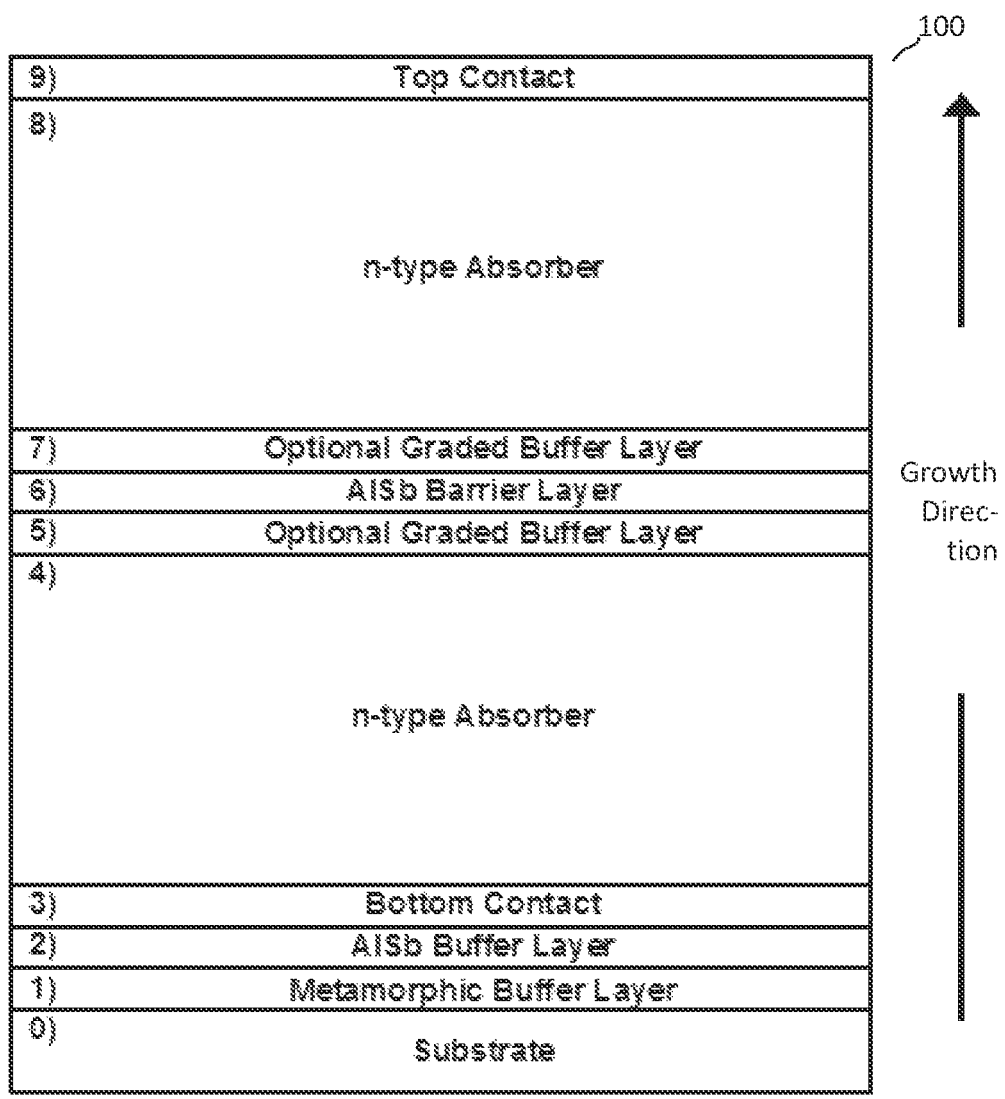
FIG. 3 shows an exemplary device structure for a two color or single color infrared detector grown on the AlSb lattice.

A method of forming an architecture of barrier infrared detector layers is depicted in FIG. 3. Specifically, FIG. 3 shows an exemplary device structure 100 for a two color or single color infrared detector grown on an AlSb lattice. Each significant layer of the detector material is numbered beginning with the substrate wafer numbered 0. The substrate for this device could be any conceivable substrate, e.g., GaSb, GaAs or Si, that would allow for the growth of a metamorphic buffer layer capable of matching the lattice constant of AlSb. Layer 1 is a transition layer, e.g., $AlAs_xSb_{(1-x)}$, $InAs_xSb_{(1-x)}$, or a combination thereof, that would include the necessary metamorphic material to bring the lattice constant from that of the substrate to match the lattice constant of AlSb. The purpose of the AlSb binary material in layer 2 is to ensure that the lattice is matched to AlSb. Layer 3 is a heavily doped bottom contact layer and could be comprised of any material with sufficient conductivity, transparency, and electrical interface characteristics, e.g., a wider gap SLS, bulk $In_xGa_{(1-x)}Sb$, or $InAs_xSb_{(1-x)}$, as to allow optical access and electrical contact to the device. Layer 4 is the 1$^{st}$ absorber layer, and may be comprised of $InAs/InAs_{(x)}Sb_{(1-x)}$ superlattice or bulk $InAs_{(x)}Sb_{(1-x)}$ lattice matched to AlSb. Layers 5 and 7 are optional graded bandgap layers where in the gap is graded in such a way as to transition the valence band level from that of the barrier to that of the absorber. The $6^{th}$ layer is the barrier of the barrier infrared detector, and is comprised fully or in part of AlSb. Layer 8 is the $2^{nd}$ absorber layer, and may be comprised of the same or a different material than the $1^{st}$ absorber layer. Layer 9 is a highly doped top contact layer.

A barrier infrared detector is lattice matched to AlSb. One such exemplary detector is comprised of a bottom contact layer, $1^{st}$ absorber layer, AlSb barrier layer, $2^{nd}$ absorber layer, and a top contact layer consecutively grown from bottom to top on an epitaxially grown layer lattice matched to AlSb. A band offset between one or more of the absorber layers and the AlSb barrier layer appears in the conduction band such that it facilitates minority carrier current flow while inhibiting majority carrier electron current flow between the two contact layers.

In another aspect, at least one of the absorber layers of such an exemplary barrier infrared detector lattice matched to AlSb is based on at least one of $InAs_{(x)}Sb_{(1-x)}$ bulk and superlattice $InAs/InAs_{(x)}Sb_{(1-x)}$ materials in order to absorb mid or long wavelength infrared radiation.

Another barrier infrared detector as lattice matched to AlSb is more extensively described. Such another exemplary detector is comprised of a bottom contact layer, $1^{st}$ absorber layer, $1^{st}$ graded bandgap buffer layer, AlSb barrier layer, $2^{nd}$ graded bandgap buffer layer, $2^{nd}$ absorber layer, and a top contact layer consecutively grown from bottom to top on an epitaxially grown layer lattice matched to AlSb. A band offset between one or more of the absorber layers and the AlSb barrier layer, and between a respective interface of the graded bandgap buffer layer and the AlSb barrier layer appears in the conduction band such that it facilitates minority carrier current flow while inhibiting majority carrier electron current flow between the two contact layers.

In another aspect, one or more of the graded bandgap buffer layers of such another exemplary barrier infrared detector lattice matched to AlSb transitions a valence band from the AlSb barrier layer to the respective absorber layer such that a sharp band offset does not occur.

In another aspect, one of the absorber layers of such an exemplary barrier infrared detector lattice matched to AlSb is based on a mix of at least one of $InAs_{(x)}Sb_{(1-x)}$ bulk and superlattice $InAs/InAs_{(x)}Sb_{(1-x)}$ materials in order to absorb mid or long wavelength infrared radiation.

For the various alternatively described exemplary barrier infrared detector lattice matched to AlSb, the top and bottom contact layers are each based on a mix of at least one of GaSb, InAs, InGaAs, $InAs_{(x)}Sb_{(1-x)}$, superlattice InAs/GaSb, Superlattice $InAs/InAs_{(x)}Sb_{(1-x)}$, and superlattice $InAs/InAs_{(x)}Sb_{(1-x)}$ materials doped heavily with n or p-type impurities.

In another aspect, one of the absorber layers of such an exemplary barrier infrared detector lattice matched to AlSb is based on a mix of at least one of $InAs_{(x)}Sb_{(1-x)}$ bulk and superlattice $InAs/InAs_{(x)}Sb_{(1-x)}$ materials in order to absorb mid or long wavelength infrared radiation.

It is obvious that many modifications and variations of the present invention are possible in light of the above teachings. It is therefore to be understood that within the scope of the appended claims, the invention may be practiced otherwise than as described.

What is claimed is:

1. A barrier infrared detector lattice matched to AlSb, the detector comprising;
    a bottom contact layer;
    $1^{st}$ absorber layer;
    AlSb barrier layer;
    $2^{nd}$ absorber layer; and
    a top contact layer, wherein the layers are consecutively grown from the bottom contact layer to the top contact layer on an epitaxially grown layer lattice matched to AlSb, wherein a band offset between one or more of the absorber layers and the AlSb barrier layer appears in the conduction band such that it facilitates minority carrier current flow while inhibiting majority carrier electron current flow between the two contact layers.

2. The barrier infrared detector of claim 1, wherein at least one of the absorber layers is based on at least one of $InAs_{(x)}Sb_{(1-x)}$ bulk and superlattice $InAs/InAs_{(x)}Sb_{(1-x)}$ materials in order to absorb mid or long wavelength infrared radiation.

3. The barrier infrared detector of claim 1, comprising a graded layer to transition a valence band from the AlSb barrier layer to either one or both of the absorber layers such that a sharp band offset does not occur.

4. The barrier infrared detector of claim 1, where the top and bottom contact layers are based on at least one of GaSb, InAs, InGaAs, $InAs_{(x)}Sb_{(1-x)}$, superlattice InAs/GaSb, Superlattice $InAs/InAs_{(x)}Sb_{(1-x)}$, and superlattice $InAs/InAs_{(x)}Sb_{(1-x)}$ materials doped heavily with n or p-type impurities.

5. The barrier infrared detector of claim 1, wherein one of the absorber layers is based on at least one of $InAs_{(x)}Sb_{(1-x)}$ bulk and superlattice $InAs/InAs_{(x)}Sb_{(1-x)}$ materials to absorb mid or long wavelength infrared radiation.

6. A barrier infrared detector lattice matched to AlSb, the detector comprising;
    a bottom contact layer;
    $1^{st}$ absorber layer;
    $1^{st}$ graded bandgap buffer layer
    AlSb barrier layer;
    $2^{nd}$ graded bandgap buffer layer;
    $2^{nd}$ absorber layer; and
    a top contact layer, wherein the layers are consecutively grown from the bottom contact layer to the top contact layer on an epitaxially grown layer lattice matched to AlSb, wherein band offset between one or more of the absorber layers and the AlSb barrier layer, and between a respective interface of the graded bandgap buffer layer and the AlSb barrier layer appears in the conduction band such that it facilitates minority carrier current flow while inhibiting majority carrier electron current flow between the two contact layers.

7. The barrier infrared detector of claim 6, wherein the absorber layers are based on at least one of $InAs_{(x)}Sb_{(1-x)}$ bulk and superlattice $InAs/InAs_{(x)}Sb_{(1-x)}$ materials to absorb mid or long wavelength infrared radiation.

8. The barrier infrared detector of claim 6, wherein said graded bandgap buffer layers serve to transition the valence band from the AlSb barrier to the respective absorber layer such that a sharp band offset does not occur.

9. The barrier infrared detector of claim 6, wherein the top and bottom contact layers are based on at least one of GaSb, InAs, InGaAs, $InAs_{(x)}Sb_{(1-x)}$, superlattice InAs/GaSb, Superlattice $InAs/InAs_{(x)}Sb_{(1-x)}$, and superlattice $InAs/InAs_{(x)}Sb_{(1-x)}$, materials doped heavily with n or p-type impurities.

10. The barrier infrared detector of claim 6, wherein one of said absorber layers is based on at least one of $InAs_{(x)}$ $Sb_{(1-x)}$ bulk and superlattice $InAs/InAs_{(x)}Sb_{(1-x)}$ materials to absorb mid or long wavelength infrared radiation.

11. A method of forming a barrier infrared detector architecture based on growing layers on an AlSb lattice, the method comprising the steps of:
- disposing a substrate capable of growing buffer layers to match the lattice constant of AlSb;
- forming a metamorphic buffer layer on the substrate to transition towards matching the lattice constant of AlSb;
- forming an AlSb buffer layer on the metamorphic buffer layer to match the lattice to AlSb;
- forming a bottom contact layer on the AlSb buffer layer for optical access and electrical contact to the detector;
- forming a $1^{st}$ absorber layer lattice matched to AlSb;
- forming a barrier layer based on AlSb;
- forming a $2^{nd}$ absorber layer; and
- forming a highly doped top contact layer.

12. The method of forming a barrier infrared detector architecture as recited in claim 11, wherein the metamorphic buffer layer is a transition layer based on a metamorphic material to bring the lattice constant from that of the substrate to match the lattice constant of AlSb.

13. The method of forming a barrier infrared detector architecture as recited in claim 11, wherein the bottom contact layer is a heavily doped bottom contact layer to provide for optical access and electrical contact to the detector.

14. The method of forming a barrier infrared detector architecture as recited in claim 11, comprising further steps of:
- forming a graded bandgap layer prior to forming said barrier layer; and
- forming another graded bandgap layer upon forming said barrier layer, where in a bandgap is graded to transition a valence band level of said barrier layer to that of the respective absorber layer.

15. The method of forming a barrier infrared detector architecture as recited in claim 11, wherein said $1^{st}$ absorber layer lattice matched to AlSb is comprised of at least one of $InAs/InAs_{(x)}Sb_{(1-x)}$ superlattice and bulk $InAs_{(x)}Sb_{(1-x)}$ lattice matched to AlSb.

16. The method of forming a barrier infrared detector architecture as recited in claim 11, wherein said $2^{nd}$ absorber layer is comprised of at least one of $InAs/InAs_{(x)}Sb_{(1-x)}$ superlattice and bulk $InAs_{(x)}Sb_{(1-x)}$ lattice matched to AlSb.

17. The method of forming a barrier infrared detector architecture as recited in claim 11, wherein the top and bottom contact layers are based on at least one of GaSb, InAs, InGaAs, $InAs_{(x)}Sb_{(1-x)}$, superlattice InAs/GaSb, Superlattice $InAs/InAs_{(x)}Sb_{(1-x)}$, and superlattice $InAs/InAs_{(x)}Sb_{(1-x)}$ materials doped heavily with n or p-type impurities.

* * * * *